United States Patent
Lee et al.

(10) Patent No.: US 9,324,445 B2
(45) Date of Patent: Apr. 26, 2016

(54) HIGH-VOLTAGE SWITCHING CIRCUIT FOR FLASH MEMORY DEVICE

(71) Applicants: FIDELIX CO., LTD., Seongnam-si, Gyeonggi-do (KR); Nemostech Co., Ltd., Seongnam-si, Gyeonggi-do (KR)

(72) Inventors: Hae Uk Lee, Suwon-si (KR); Man Seok Soh, Yongin-si (KR)

(73) Assignees: FIDELIX CO., LTD., Seongnam-Si, Gyeonggi-Do (KR); NEMOSTECH CO., LTD., Seongnam-Si, Gyeonggi-Do (KR)

( * ) Notice: Subject to any disclaimer, the term of this patent is extended or adjusted under 35 U.S.C. 154(b) by 0 days.

(21) Appl. No.: 14/723,639

(22) Filed: May 28, 2015

(65) Prior Publication Data

US 2015/0364203 A1    Dec. 17, 2015

(30) Foreign Application Priority Data

Jun. 16, 2014   (KR) .................. 10-2014-0072534
Jun. 24, 2014   (KR) .................. 10-2014-0077183

(51) Int. Cl.
*G11C 11/34*    (2006.01)
*G11C 16/04*    (2006.01)
*G11C 16/30*    (2006.01)
*H01L 27/115*    (2006.01)

(52) U.S. Cl.
CPC .............. *G11C 16/30* (2013.01); *H01L 27/115* (2013.01); *H01L 27/11529* (2013.01)

(58) Field of Classification Search
CPC . G11C 16/30; H01L 27/115; H01L 27/11529
USPC .............................. 365/185.18; 327/534, 536
See application file for complete search history.

(56) References Cited

U.S. PATENT DOCUMENTS

| | | | |
|---|---|---|---|
| 6,438,032 B1* | 8/2002 | Pekny | G11C 5/145 365/185.18 |
| 6,515,903 B1* | 2/2003 | Le | G11C 16/30 327/536 |
| 8,040,174 B2* | 10/2011 | Likhterov | H02M 3/07 327/534 |
| 2008/0151630 A1* | 6/2008 | Pan | G11C 16/30 365/185.18 |

* cited by examiner

*Primary Examiner* — Toan Le
(74) *Attorney, Agent, or Firm* — Kile Park Reed & Houtteman PLLC

(57) ABSTRACT

A high-voltage switching device for a flash memory includes at least one pumping transistor which includes one junction terminal and another junction terminal which are commonly connected to a control signal, and a gate terminal connected to a select signal. The high-voltage switching device also includes at least one switching transistor that includes one junction terminal connected to an input signal, another junction terminal connected to an output signal, and a gate terminal connected to the select signal. A layout of the high-voltage switching device includes a pumping active area in which the one junction terminal and the another junction terminal of the pumping transistor are disposed; a control interconnection area in which an interconnection of the control signal is wired; and a select interconnection area in which an interconnection of the select signal is wired.

17 Claims, 4 Drawing Sheets

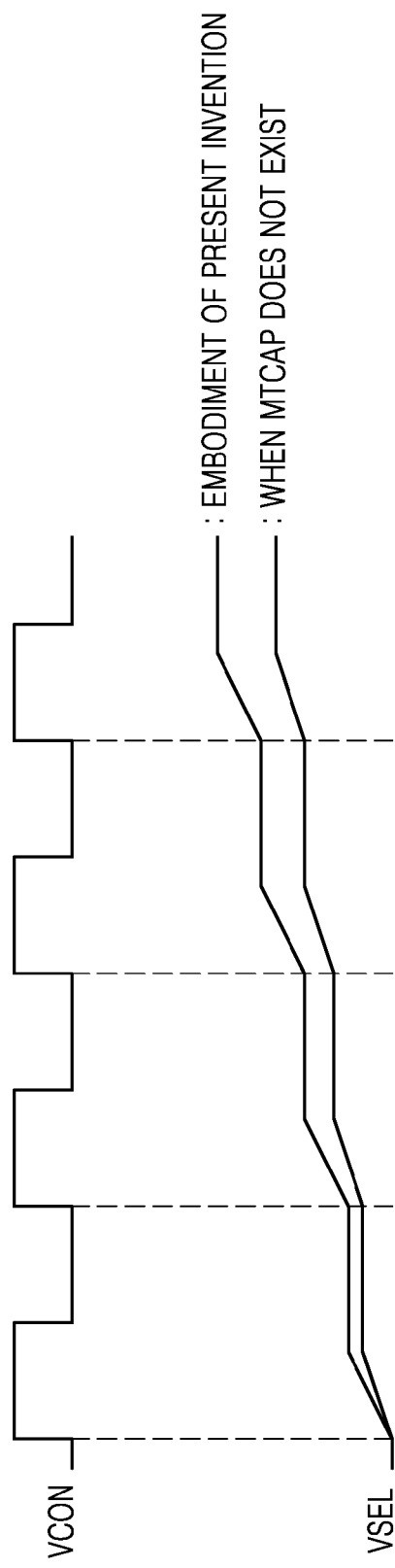

HIGH-VOLTAGE SWITCHING CIRCUIT FOR FLASH MEMORY DEVICE

CROSS-REFERENCE TO RELATED APPLICATION

This application claims priority to and the benefit of Korean Patent Application No. 10-2014-0072534 and 10-2014-0077183, filed on Jun. 16, 2014 and Jun. 24, 2014, respectively, the disclosure of which is incorporated herein by reference in its entirety.

BACKGROUND

1. Field of the Invention

The present invention relate to a flash memory device, and more particularly, a high-voltage switching circuit for a flash memory device and a pumping circuit for the high-voltage switching circuit.

2. Discussion of Related Art

Flash memory devices are nonvolatile memory devices for performing a program operation and an erase operation. In the program operation and the erase operation, a high level voltage is used in the flash memory devices. In general, to this end a switching device is equipped to transmit a high level voltage in a flash memory device.

The conventional switching device generally includes a switching metal-oxide semiconductor (MOS) transistor and a pumping MOS transistor. The switching MOS transistor is gated by a select signal and configured to transmit a high level voltage. Also, the pumping MOS transistor operates as a pumping capacitor, and is configured to increase a voltage level of the select signal through a pumping operation.

Therefore, it is desired that a switching device is capable of increasing a capacitance of the pumping capacitor to increase a voltage level of the select signal. Further, since a layout area of the switching device is apt to increase as the capacitance increases, a need exists for a switching device for a flash memory which is able to minimize the increase of or even no or little increase in the layout area of the switching device while increasing the capacitance.

SUMMARY OF THE INVENTION

The present invention is directed to a high-voltage switching device for a flash memory, which is capable of efficiently transmitting a high level voltage while minimizing a layout area of the high-voltage switching device.

According to an aspect of the present invention, there is provided a high voltage switching unit of a flash memory device including a pumping circuit including at least one pumping transistor having one junction terminal and another junction terminal which are commonly connected to a node of a control signal which is periodically transitioned, and a gate terminal connected to a node of a select signal; a switching circuit including at least one switching transistor having one junction terminal connected to a node of an input signal, another junction terminal connected to a node of an output signal, and a gate terminal connected to the node of the select signal; a pumping active area in which the one junction terminal and the another junction terminal of the at least one pumping transistor are disposed and a channel of the at least one pumping transistor is formed; a control interconnection area in which an interconnection of the control signal is wired; and a select interconnection area in which an interconnection of the select signal is wired. The control interconnection area and the select interconnection area extend in parallel in at least one region of which length is greater than a length of the pumping active area in a direction of the channel, and a capacitance is formed between the control interconnection area and the select interconnection area to increase a voltage level of the select signal.

The control interconnection area can extend in parallel on both sides of the select interconnection area in at least one region of which length is greater than the length of the pumping active area in the direction of the channel.

The high voltage switching unit may further comprise a switching gate area in which the gate terminal of the at least one switching transistor is wired, wherein the select interconnection area extends over the switching gate area, and the control interconnection area extends in parallel on both sides of the select interconnection area in the switching gate area. The high voltage switching unit may also comprise a switching gate area in which the gate terminal of the at least one switching transistor is wired, wherein the select interconnection area and the control interconnection area extend in parallel in the switching gate area.

The control signal may be a pulse signal which repeats periodic transitions, and the voltage level of the select signal increases in response to the periodic transitions. The pumping circuit may include a gate poly layer forming the gate terminal of the at least one pumping transistor, and the gate poly layer may be disposed between the control interconnection area and the channel of the at least one pumping transistor to form a capacitance between the control interconnection area and the gate ploy layer and another capacitance between the channel of the at least one pumping transistor and the gate ploy layer.

The control interconnection area may cover an entire area of the channel of the at least one pumping transistor. The at least one pumping transistor can be disposed to be in parallel with the capacitance formed between the control interconnection area and the select interconnection area.

According to another aspect of the present invention, there is provided a high voltage switching unit of a flash memory device comprising a pumping circuit including at least one pumping transistor having one junction terminal and another junction terminal which are commonly connected to a node of a control signal which is periodically transitioned, and a gate terminal connected to a node of a select signal; a switching circuit including at least one switching transistor having one junction terminal connected to a node of an input signal, another junction terminal connected to a node of an output signal, and a gate terminal connected to the node of the select signal; a pumping active area in which the one junction terminal and the another junction terminal of the at least one pumping transistor are disposed and a channel of the at least one pumping transistor is formed; a control interconnection area in which an interconnection of the control signal is wired; and a select interconnection area in which an interconnection of the select signal is wired. The control interconnection area covers at least one portion of the channel of the at least one pumping transistor, and a capacitance is formed between the control interconnection area and the at least one portion of the channel to increase a voltage level of the select signal. The control interconnection area can cover an entire area of the pumping active area.

According to another aspect of the present invention, there is provided a pumping circuit having at least one pumping transistor for providing a pumping capacitance in a switching device of a flash memory, the at least one pumping transistor comprising one junction terminal and another junction terminal which are commonly connected to a node of a control signal which is periodically transitioned; a gate terminal connected to a node of a select signal; a pumping active area in which the one junction terminal and the another junction terminal of the at least one pumping transistor are disposed and a channel of the at least one pumping transistor is formed; and a control interconnection area in which an interconnection of the control signal is wired. The control interconnection area covers at least one portion of the pumping active area to form a capacitance between the control interconnection area and the at least one portion of the pumping active area.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 4 is a graphical view of signal waveforms of the high-voltage switching unit of the flash memory device according to an embodiment of the present invention.

DETAILED DESCRIPTION OF EXEMPLARY EMBODIMENTS

Hereinafter, exemplary embodiments of the present invention will be described in detail with reference to the accompanying drawings. In numbering reference marks to the structural parts of each drawing, like numerals may refer to like elements throughout the description of the figures although the reference marks are displayed in different drawings.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Figure 1:
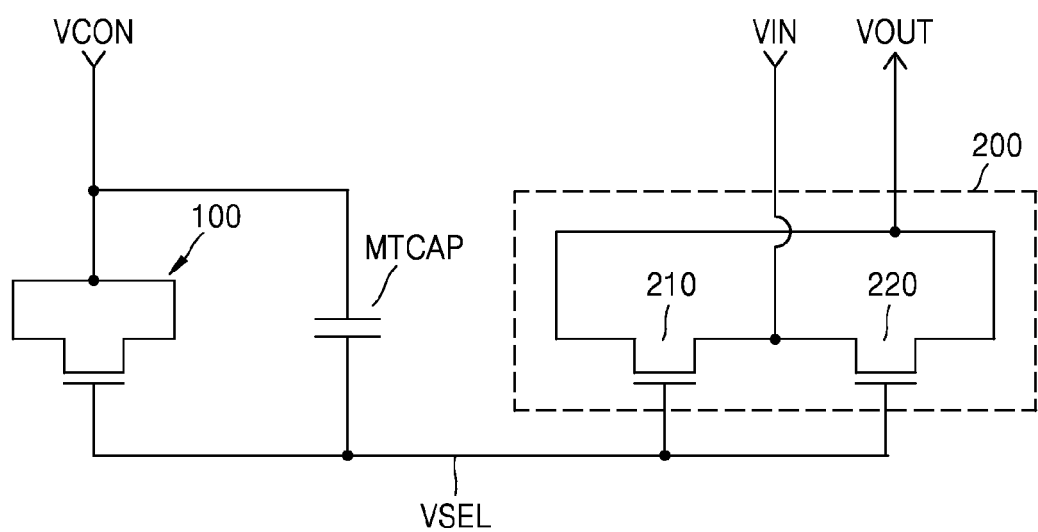
FIG. 1 is a circuit diagram illustrating a high-voltage switching unit of a flash memory device according to an embodiment of the present invention.
Figure 2:
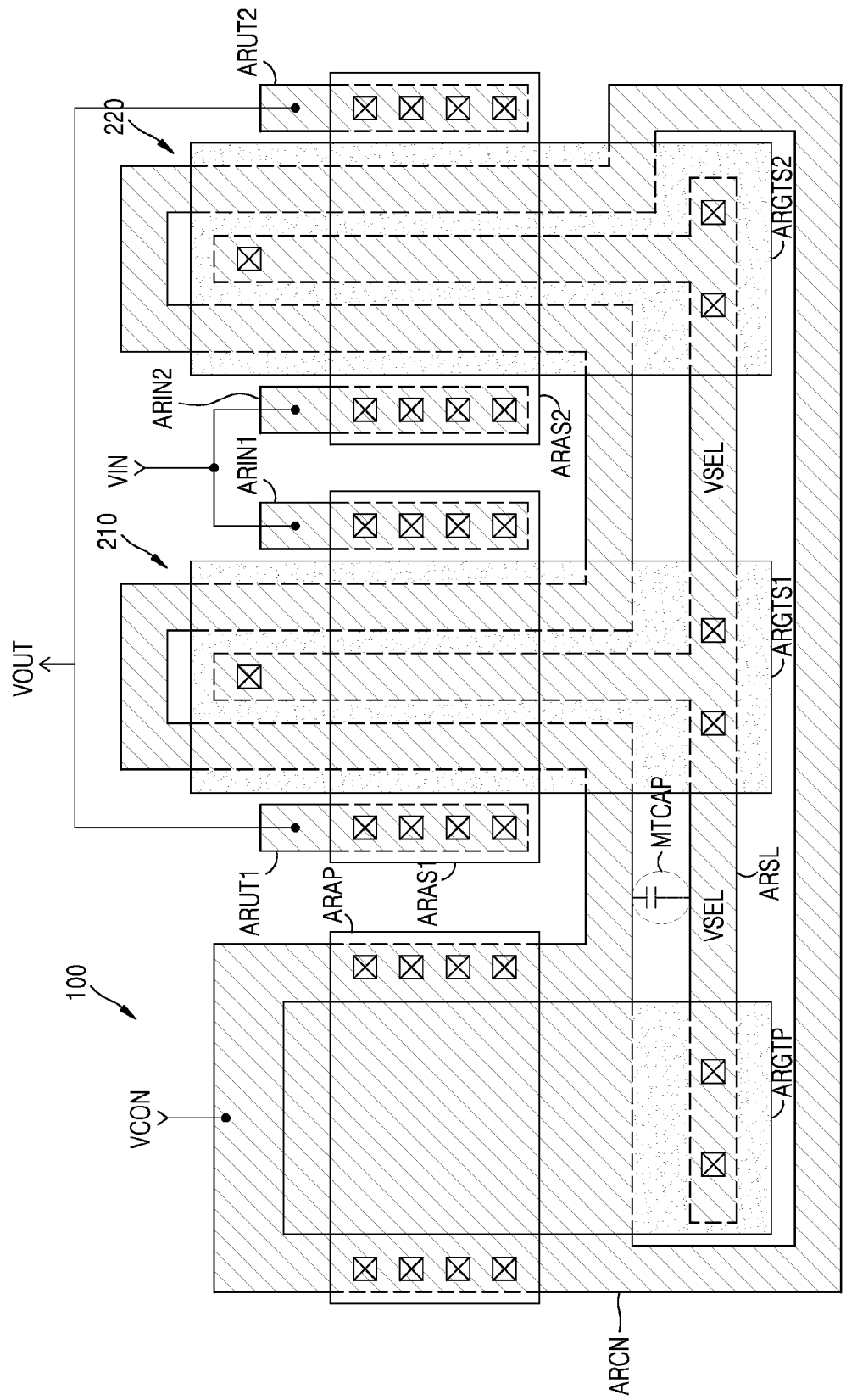
FIG. 2 is a plan view illustrating a layout of the high-voltage switching unit of the flash memory device according to an embodiment of the present invention.

FIG. 1 is a circuit diagram illustrating a high-voltage switching unit of a flash memory device according to an embodiment of the present invention, and FIG. 2 is a plan view illustrating a layout of the high-voltage switching unit of the flash memory device that is shown in FIG. 1.

Referring to FIGS. 1 and 2, the high-voltage switching unit of the flash memory device according to the embodiment of the present invention includes a pumping circuit and a switching circuit 200. The pumping circuit includes at least one pumping transistor 100. In this exemplary embodiment, the at least one pumping transistor 100 is implemented with at least one metal-oxide semiconductor (MOS) transistor. The switching circuit 200 includes at least one switching transistor which can be implemented with at least one MOS transistor. In this embodiment, the switching circuit 200 includes two MOS transistors 210 and 220 as shown in FIG. 1.

Referring to FIG. 2, the layout of the high-voltage switching unit of the flash memory device of the embodiment of the present invention includes a pumping active area ARAP, a control interconnection area ARCN, and a select interconnection area ARSL.

One junction terminal and the other junction terminal of the pumping transistor 100 of the pumping circuit are commonly connected to a node of a control signal VCON, and a gate terminal of the pumping transistor 100 is connected to a node of a select signal VSEL.

For example, the control signal VCON is a pulse signal which is periodically transitioned (refer to FIG. 4).

The pumping transistor 100 serves as a capacitor and it increases a voltage level of the select signal VSEL based on an increasing transition of the control signal VCON.

A channel of the pumping transistor 100 is formed in the pumping active area ARAP, and the one junction terminal and the other junction terminal of the pumping transistor 100 are disposed in the pumping active area ARAP.

Also, the node of the control signal VCON is wired in the control interconnection area ARCN. Here, the node of the control signal VCON is formed of a metal layer, and is applied to the pumping active area ARAP through a contact hole.

Reference 'ARGTP' represents an area in which the gate terminal of the pumping transistor 100 is wired as a gate poly layer. The channel of the pumping transistor 100 is formed in an area overlapping the pumping active area ARAP.

In the layout of the high-voltage switching unit of the flash memory device of the embodiment of the present invention, the control interconnection area ARCN covers at least one portion of the channel of the pumping transistor 100. In a different embodiment, however, the control interconnection area ARCN can entirely cover the channel of the pumping transistor 100 or the pumping active area ARAP.

Figure 3:
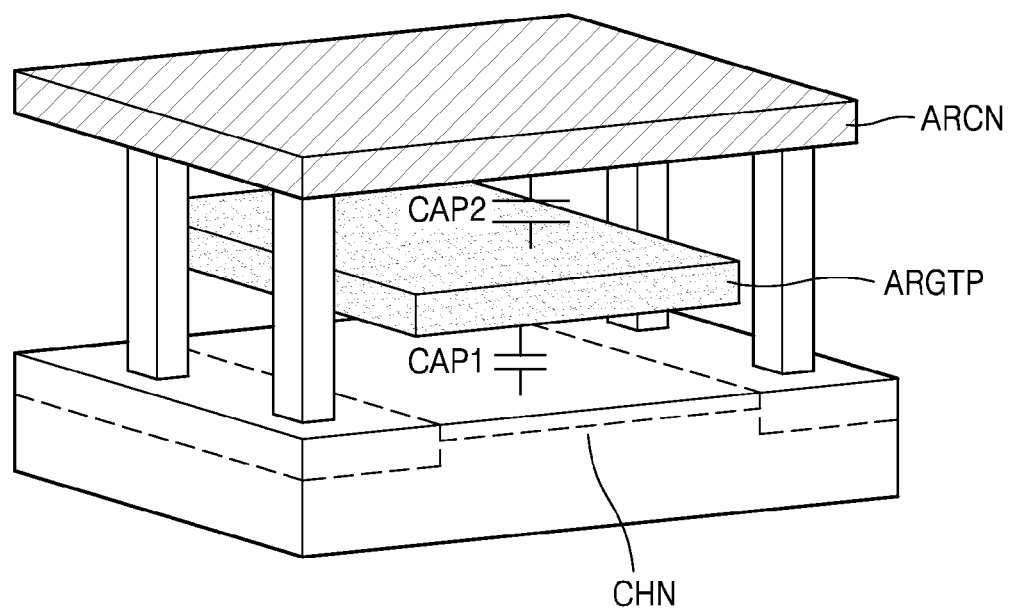
FIG. 3 is a three-dimensional schematic diagram of a portion of the high-voltage switching unit of the flash memory device according to an embodiment of the present invention.

Referring to FIG. 3, in the pumping transistor 100, the gate poly layer ARGTP forming the gate terminal is disposed between the control interconnection area ARCN and the channel CHN of the pumping transistor 100 and generates a capacitance CAP1 by the channel CHN of the pumping transistor 100 formed thereunder, and another capacitance CAP2 by a metal layer formed thereon in the control interconnection area ARCN. The pumping transistor generates the capacitances at both an upper portion and a lower portion of the gate poly layer ARGTP.

Thus, a capacitance of the pumping transistor 100 which serves as a pumping capacitor is increased at least by the sum of the capacitance CAP1 and another capacitance CAP2.

As a result, in the high-voltage switching unit of the flash memory device of the embodiment of the present invention, a voltage level of the select signal VSEL is increased in accordance with the increasing transition of the control signal VCON (refer to FIG. 4).

In the high-voltage switching unit of the present invention, no or little area is additionally required to increase the capacitance of the pumping transistor 100 or the pumping capacitor.

Referring again to FIGS. 1 and 2, reference 'MTCAP' represents a metal capacitor formed by wiring for the node of the control signal VCON and the node of the select signal VSEL in the layout of the high-voltage switching unit of the flash memory device of the embodiment of the present invention.

The metal capacitor MTCAP is connected to the pumping capacitor (or MOS capacitor) of the pumping transistor 100 in parallel. Here, the metal capacitor MTCAP and the MOS capacitor of the pumping transistor 100 operate as pumping capacitors in the high-voltage switching unit of the flash memory device.

Thus, overall capacitance of the pumping circuit is increased.

As a result, in the high-voltage switching unit of the flash memory device, the voltage level of the select signal VSEL increases in accordance with the increasing transition of the control signal VCON.

Referring back to FIG. 1, the switching circuit 200 can be configured with at least one switching transistor (for example, MOS transistor), and a node of an input signal VIN is connected to one junction terminal of the switching transistor, a node of an output signal VOUT is connected to the other junction terminal of the switching transistor, and a node of the select signal VSEL is connected to a gate terminal of the switching transistor.

The switching circuit 200 can include a plurality of switching transistors. In this embodiment, the switching circuit 200 is configured with two switching transistors 210 and 220 which are connected in parallel. The two switching transistors 210 and 220 can be implemented with two MOS transistors, respectively.

In the two switching transistors 210 and 220, the node of the input signal VIN is connected to each of the junction terminals (for example, drain terminals) of the switching transistors 210 and 220, and the node of the output signal VOUT is connected to each of the other junction terminals (for example, source terminals) of the switching transistors 210 and 220. Also, the gate terminals of the switching transistors are connected to the node of the select signal VSEL.

In FIG. 2, reference 'ARAS1' represents an area in which one junction terminal and the other junction terminal of the first switching transistor 210 are disposed to form a channel of the first switching transistor 210. In a same manner, reference 'ARAS2' represents an area where one junction terminal and the other junction terminal of the second switching transistor 220 are disposed to form a channel of the second switching transistor 220.

Reference 'ARGTS1' represents an area in which the gate terminal of the first switching transistor 210 is formed, and reference 'ARGTS2' represents an area in which the gate terminal of the second switching transistor 220 is formed. Those areas ARGTS1 and ARGTS2 may be referred to as switching gate areas.

Reference 'ARIN1' represents an area in which the node of the input signal VIN is wired in connection with the first switching transistor 210, and reference 'ARIN2' represents an area in which the node of the input signal VIN is wired in connection with the second switching transistor 220. Here, the node of the input signal VIN is formed of a metal layer, and is applied to the areas ARAS1 and ARAS2 through contact holes.

Reference 'ARUT1' represents an area in which the node of the output signal VOUT is wired in connection with the first switching transistor 210, and reference 'ARUT2' represents an area in which the node of the output signal VOUT is wired in connection with the second switching transistor 220. Here, the node of the output signal VOUT is formed of a metal layer, and is applied to the areas ARAS1 and ARAS2 through contact holes.

Also, in the select interconnection area ARSL the node of the select signal VSEL is wired. Here, the node of the select signal VSEL is formed of a metal layer, and is applied to the area ARGTP, the area ARGTS1 and the area ARGTS2 through contact holes.

In the layout of the high-voltage switching unit of the flash memory device of the embodiment of the present invention, the control interconnection area ARCN and the select interconnection area ARSL extend in parallel in at least one region of which length is greater than a length of the pumping active area ARAP in a channel direction. As a result, the metal capacitor MTCAP is formed between the control interconnection area ARCN and the select interconnection area ARSL.

In another embodiment, the control interconnection area ARCN extends in parallel on both sides of the select interconnection area ARSL in at least one region of which length is greater than the length of the pumping active area ARAP in the channel direction. Thus, a capacitance of the metal capacitor MTCAP is greatly increased.

In another embodiment, the select interconnection area ARSL extends over the switching gate areas ARGTS1 and ARGTS2, and the control interconnection area ARCN extends in parallel on both sides of the select interconnection area ARSL on the switching gate areas ARGTS1 and ARGTS2. Thus, the capacitance of the metal capacitor MTCAP is more greatly increased.

In the layout of the high-voltage switching unit of the flash memory device of the embodiment of the present invention, all or majority of the control interconnection area ARCN and the select interconnection area ARSL to form the metal capacitor MTCAP overlap with the areas that are required to form the pumping circuit and the switching circuit 200. That is, no or little area is additionally required to form the metal capacitor MTCAP in the high-voltage switching unit of the present invention.

Thus, the layout of the high-voltage switching unit of the flash memory device of the embodiment of the present invention requires no or little increase in the overall layout area while forming the metal capacitor MTCAP as well as the pumping capacitor. In other words, the high-voltage switching unit of the flash memory device of the present invention requires no or little increase in the layout area while the overall capacitance is increased by at least the sum of the capacitances of the pumping capacitor and the metal capacitor MTCAP.

As a result, in the high voltage switching unit of the flash memory device according to the embodiment of the present invention, the voltage level of the select signal VSEL which gates the switching circuit 200 is increased to provide a high level voltage of the select signal VSEL, as shown in FIG. 4 where the select signal VSEL of the high voltage switching unit of the present invention is compared with that of a conventional switching device which has no metal capacitor or the like.

Thus, according to the high-voltage switching unit of the flash memory device of the embodiment of the present invention, the high level voltage of the select signal VSEL can be efficiently transmitted while no or little increase is made in the layout area.

The above description of the invention is for illustrative purposes only. It will be understood by one of ordinary skill in the art that it is possible to easily modify the present invention into other specific forms without deviating from the technical spirit or essential features of the present invention. Therefore, the embodiments described above are to be understood as being non-limiting in every way.

For example, in the present specification, the number of the switching transistors 210 and 220 connected in parallel is described as two. However, it should be understood by one of ordinary skill in the art that the number of the switching transistors may be expanded to three or more.

Thus, the scope of the invention should be construed to be set forth by the claims below rather than the foregoing description, the meaning and scope, and all changes or variations derived from the equivalent concept of the appended claims are included within the scope of the present invention.

What is claimed is:

1. A high voltage switching unit of a flash memory device including:
   a pumping circuit including at least one pumping transistor having one junction terminal and another junction terminal which are commonly connected to a node of a control signal which is periodically transitioned, and a gate terminal connected to a node of a select signal;
   a switching circuit including at least one switching transistor having one junction terminal connected to a node of an input signal, another junction terminal connected to a node of an output signal, and a gate terminal connected to the node of the select signal;
   a pumping active area in which the one junction terminal and the another junction terminal of the at least one pumping transistor are disposed and a channel of the at least one pumping transistor is formed;
   a control interconnection area in which an interconnection of the control signal is wired; and
   a select interconnection area in which an interconnection of the select signal is wired,
   wherein the control interconnection area and the select interconnection area extend in parallel in at least one region of which length is greater than a length of the pumping active area in a direction of the channel, and a capacitance is formed between the control interconnection area and the select interconnection area to increase a voltage level of the select signal.

2. The high voltage switching unit of claim 1, wherein the control interconnection area extends in parallel on both sides of the select interconnection area in at least one region of which length is greater than the length of the pumping active area in the direction of the channel.

3. The high voltage switching unit of claim 1, further comprising a switching gate area in which the gate terminal of the at least one switching transistor is wired,
   wherein the select interconnection area extends over the switching gate area, and the control interconnection area extends in parallel on both sides of the select interconnection area in the switching gate area.

4. The high voltage switching unit of claim 1, further comprising a switching gate area in which the gate terminal of the at least one switching transistor is wired,
   wherein the select interconnection area and the control interconnection area extend in parallel in the switching gate area.

5. The high voltage switching unit of claim 1, wherein the control signal is a pulse signal which repeats periodic transitions, and the voltage level of the select signal increases in response to the periodic transitions.

6. The high voltage switching unit of claim 1, wherein the pumping circuit includes a gate poly layer forming the gate terminal of the at least one pumping transistor, and the gate poly layer is disposed between the control interconnection area and the channel of the at least one pumping transistor to form a capacitance between the control interconnection area and the gate poly layer and another capacitance between the channel of the at least one pumping transistor and the gate ploy layer.

7. The high voltage switching unit of claim 1, wherein the control interconnection area covers an entire area of the channel of the at least one pumping transistor.

8. The high voltage switching unit of claim 1, wherein the at least one pumping transistor is disposed to be in parallel with the capacitance formed between the control interconnection area and the select interconnection area.

9. A high voltage switching unit of a flash memory device comprising:
   a pumping circuit including at least one pumping transistor having one junction terminal and another junction terminal which are commonly connected to a node of a control signal which is periodically transitioned, and a gate terminal connected to a node of a select signal;
   a switching circuit including at least one switching transistor having one junction terminal connected to a node of an input signal, another junction terminal connected to a node of an output signal, and a gate terminal connected to the node of the select signal;
   a pumping active area in which the one junction terminal and the another junction terminal of the at least one pumping transistor are disposed and a channel of the at least one pumping transistor is formed;
   a control interconnection area in which an interconnection of the control signal is wired; and
   a select interconnection area in which an interconnection of the select signal is wired,
   wherein the control interconnection area covers at least one portion of the channel of the at least one pumping transistor, and a capacitance is formed between the control interconnection area and the at least one portion of the channel to increase a voltage level of the select signal.

10. The high voltage switching unit of claim 9, wherein the control interconnection area covers an entire area of the pumping active area.

11. The high voltage switching unit of claim 9, wherein the control interconnection area and the select interconnection area extend in parallel in at least one region of which length is greater than a length of the pumping active area in a direction of the channel.

12. The high voltage switching unit of claim 9, wherein the control interconnection area extends in parallel on both sides of the select interconnection area in at least one region of which length is greater than a length of the pumping active area in a direction of the channel.

13. The high voltage switching unit of claim 9, further comprising a switching gate area in which the gate terminal of the at least one switching transistor is wired, wherein the select interconnection area extends over the switching gate area, and the control interconnection area extends in parallel on both sides of the select interconnection area in the switching gate area.

14. The high voltage switching unit of claim 9, wherein the control signal is a pulse signal which repeats periodic transitions, and the voltage level of the select signal increases in response to the periodic transitions.

15. A pumping circuit having at least one pumping transistor for providing a pumping capacitance in a switching device of a flash memory, the at least one pumping transistor comprising:

one junction terminal and another junction terminal which are commonly connected to a node of a control signal which is periodically transitioned;
a gate terminal connected to a node of a select signal;
a pumping active area in which the one junction terminal and the another junction terminal of the at least one pumping transistor are disposed and a channel of the at least one pumping transistor is formed; and
a control interconnection area in which an interconnection of the control signal is wired,
wherein the control interconnection area covers at least one portion of the pumping active area to form a capacitance between the control interconnection area and the at least one portion of the pumping active area.

16. The pumping circuit of claim 15, wherein the control interconnection area covers an entire area of the pumping active area.

17. The pumping circuit of claim 15, further includes a gate poly layer forming the gate terminal of the at least one pumping transistor, and the gate poly layer is disposed between the control interconnection area and the pumping active area to form a capacitance between the control interconnection area and the gate poly layer and another capacitance between the pumping active area and the gate poly layer.

\* \* \* \* \*